(12) United States Patent
Noh et al.

(10) Patent No.: US 12,272,635 B2
(45) Date of Patent: Apr. 8, 2025

(54) SEMICONDUCTOR DEVICE AND MANUFACTURING METHOD THEREOF

(71) Applicant: SK hynix Inc., Icheon-si (KR)

(72) Inventors: Jae Yoon Noh, Cheongju-si (KR); Tae Kyung Kim, Cheongju-si (KR); Hyo Sub Yeom, Cheongju-si (KR); Jeong Yun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/511,695

(22) Filed: Nov. 16, 2023

(65) Prior Publication Data

US 2024/0088021 A1   Mar. 14, 2024

Related U.S. Application Data

(62) Division of application No. 16/865,024, filed on May 1, 2020, now Pat. No. 11,901,284.

(30) Foreign Application Priority Data

Sep. 25, 2019  (KR) ........................ 10-2019-0118206

(51) Int. Cl.
*H10B 43/27* (2023.01)
*H01L 23/522* (2006.01)
*H01L 23/528* (2006.01)
*H10B 41/27* (2023.01)
*H10B 41/30* (2023.01)
*H10B 41/35* (2023.01)
(Continued)

(52) U.S. Cl.
CPC ...... *H01L 23/5226* (2013.01); *H01L 23/5283* (2013.01); *H10B 41/27* (2023.02); *H10B 41/30* (2023.02); *H10B 41/35* (2023.02); *H10B 41/41* (2023.02); *H10B 43/27* (2023.02); *H10B 43/30* (2023.02); *H10B 43/35* (2023.02); *H10B 43/40* (2023.02); *H10B 63/84* (2023.02)

(58) Field of Classification Search
None
See application file for complete search history.

(56) References Cited

U.S. PATENT DOCUMENTS 9,881,929 B1     1/2018  Ravikirthi et al.
2016/0268297 A1  9/2016  Murakami et al.
(Continued)

FOREIGN PATENT DOCUMENTS

CN    105097817 A    11/2015
CN    107768446 A     3/2018
(Continued)

*Primary Examiner* — Sarah K Salerno
(74) *Attorney, Agent, or Firm* — WILLIAM PARK & ASSOCIATES LTD.

(57) ABSTRACT

There are provided a semiconductor device and a manufacturing method thereof. The semiconductor device includes: a stack structure including a plurality of interlayer insulating layers and a plurality of gate conductive layers, which are stacked in an alternating manner; at least one support structure penetrating the stack structure in a substantially vertical manner, the at least one support structure being formed in a contact region; and a contact plug penetrating the stack structure in a substantially vertical manner, the contact plug being formed in the contact region, the contact plug being connected to a contact pad that is disposed on the bottom of the stack structure. The at least one support structure is formed of an oxide layer.

13 Claims, 21 Drawing Sheets

(51) Int. Cl.
*H10B 41/41* (2023.01)
*H10B 43/30* (2023.01)
*H10B 43/35* (2023.01)
*H10B 43/40* (2023.01)
*H10B 63/00* (2023.01)

(56) References Cited

U.S. PATENT DOCUMENTS

| | | |
|---|---|---|
| 2016/0293625 A1 | 10/2016 | Kang et al. |
| 2016/0322381 A1 | 11/2016 | Liu et al. |
| 2016/0357581 A1 | 12/2016 | Jiang et al. |
| 2017/0098657 A1 | 4/2017 | Lee |
| 2018/0053775 A1 | 2/2018 | Nam et al. |
| 2018/0277564 A1 | 9/2018 | Sugiura |
| 2018/0286678 A1 | 10/2018 | Lee et al. |
| 2019/0088672 A1 | 3/2019 | Tomimatsu |
| 2020/0006376 A1 | 1/2020 | Makala et al. |
| 2020/0075618 A1 | 3/2020 | Oike |
| 2020/0295027 A1 | 9/2020 | Sakata et al. |
| 2020/0373324 A1 | 11/2020 | Lee et al. |
| 2021/0013304 A1 | 1/2021 | Ryu et al. |
| 2021/0159243 A1 | 5/2021 | Hu et al. |

FOREIGN PATENT DOCUMENTS

| | | |
|---|---|---|
| CN | 108695335 A | 10/2018 |
| CN | 108886040 A | 11/2018 |
| CN | 109509756 A | 3/2019 |
| CN | 109545786 A | 3/2019 |
| KR | 100792366 B1 | 1/2008 |
| KR | 1020140086640 A | 7/2014 |
| KR | 1020200106785 A | 9/2020 |

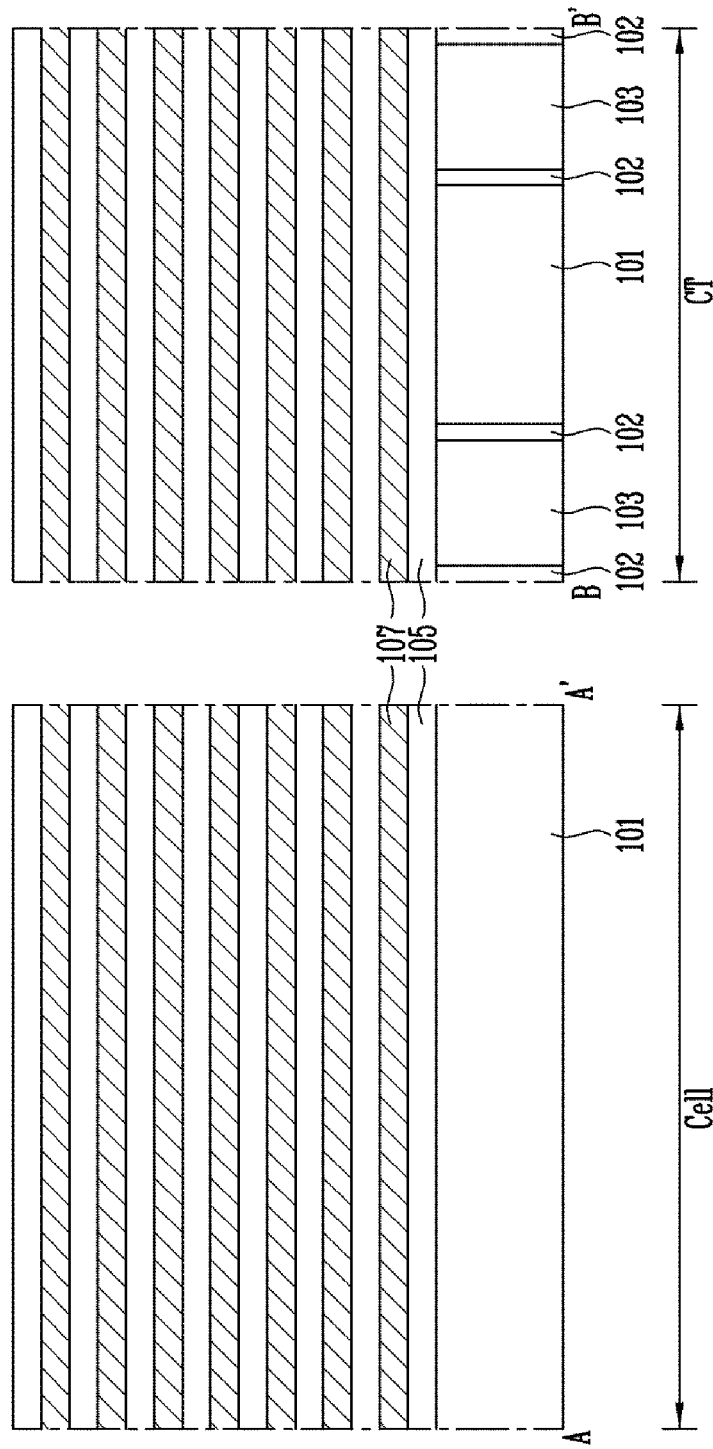

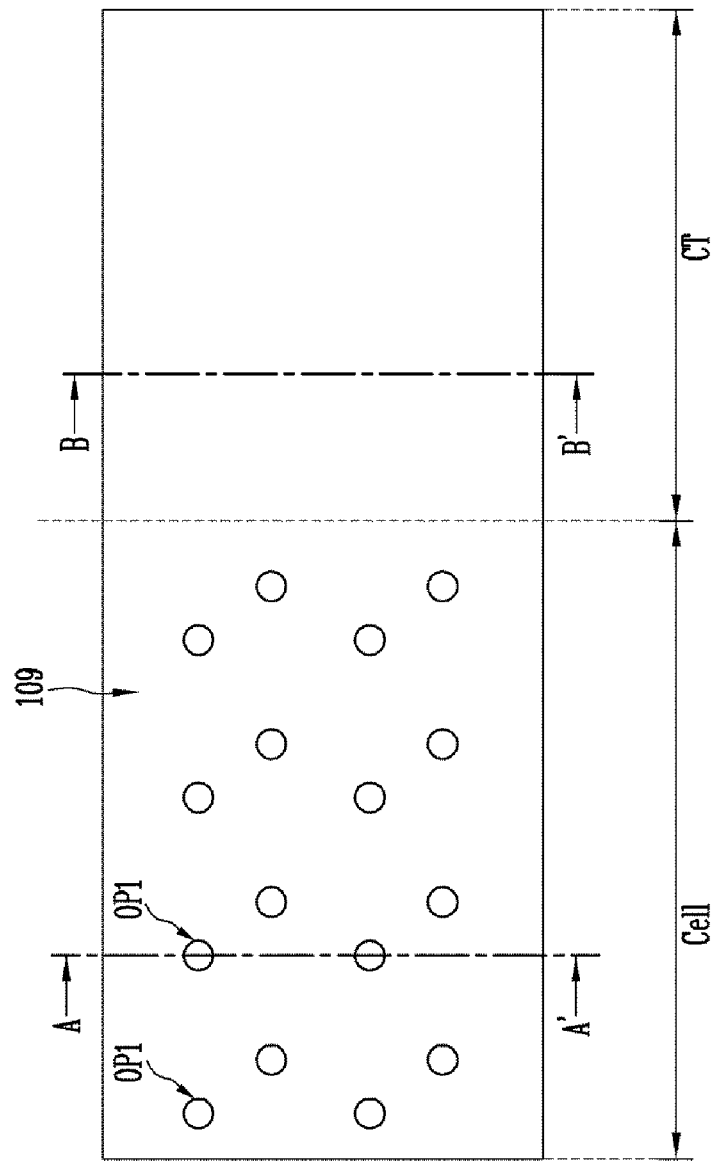

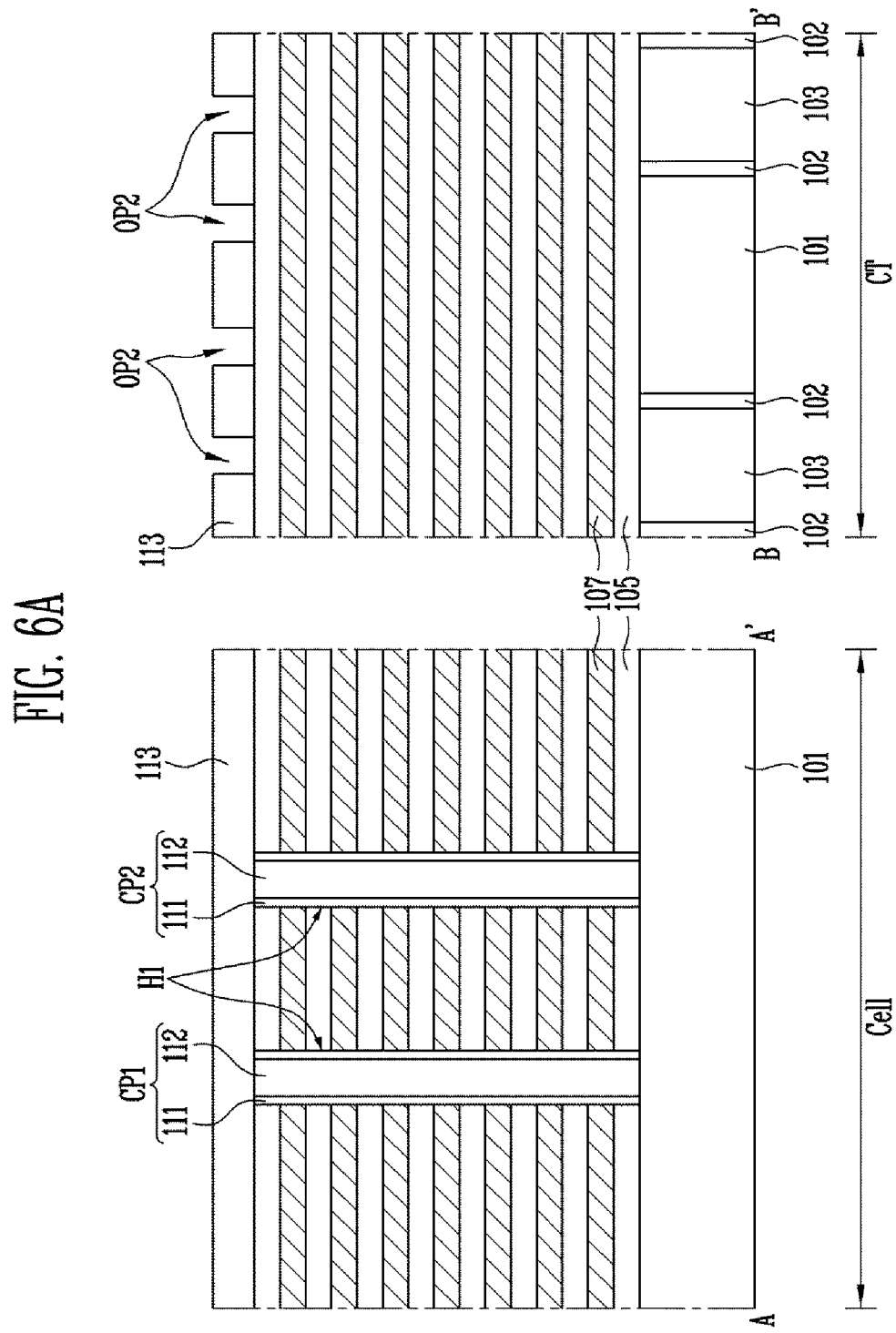

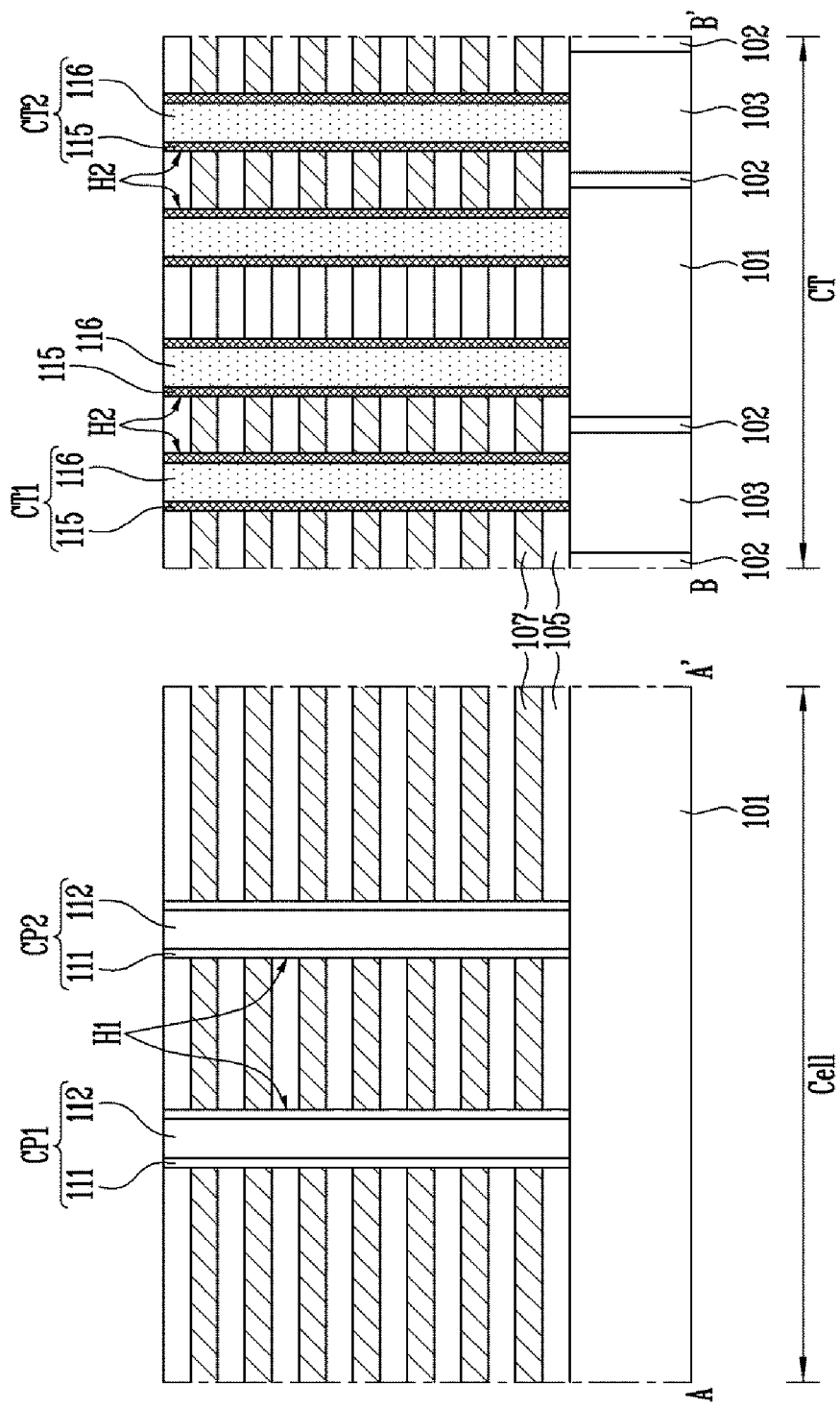

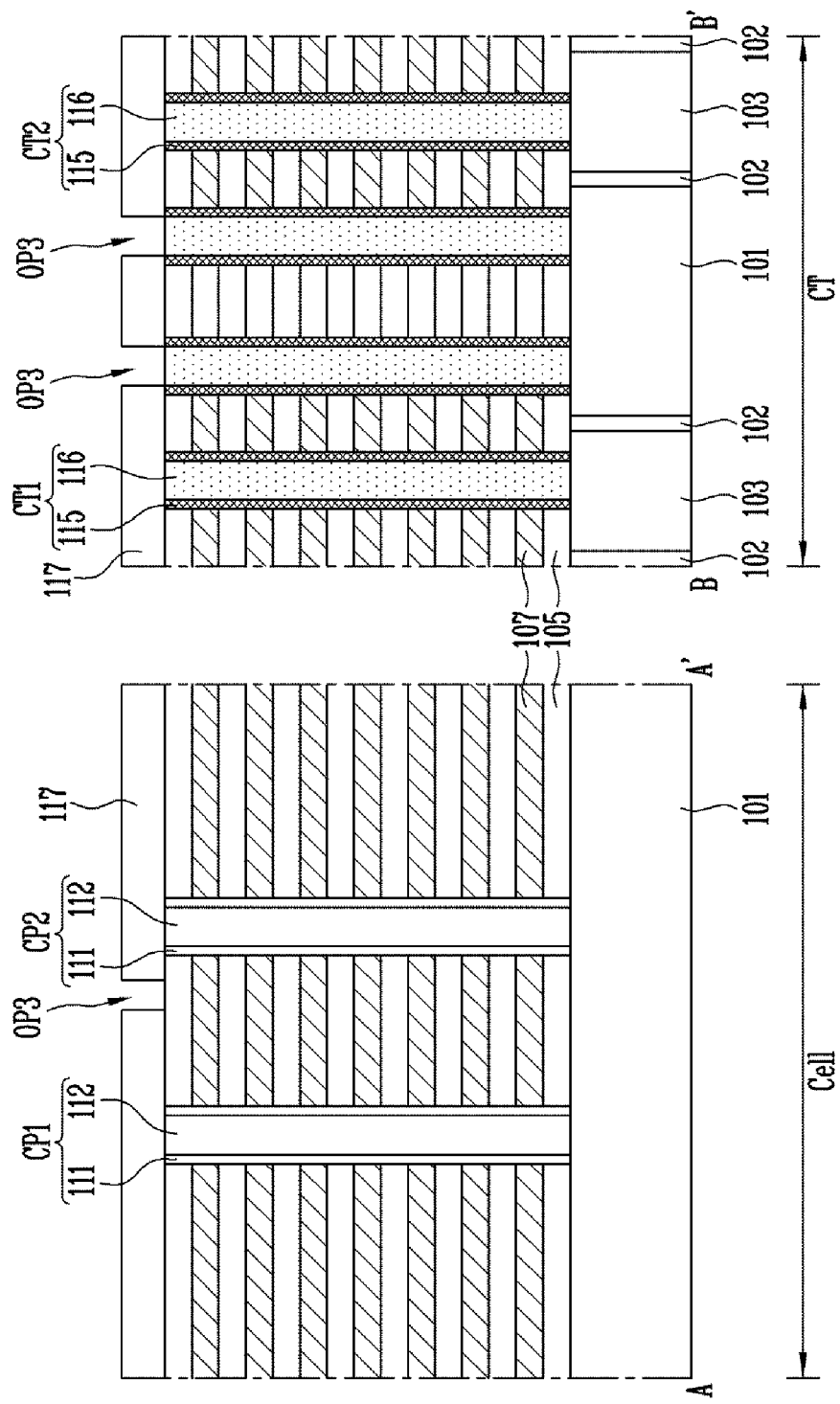

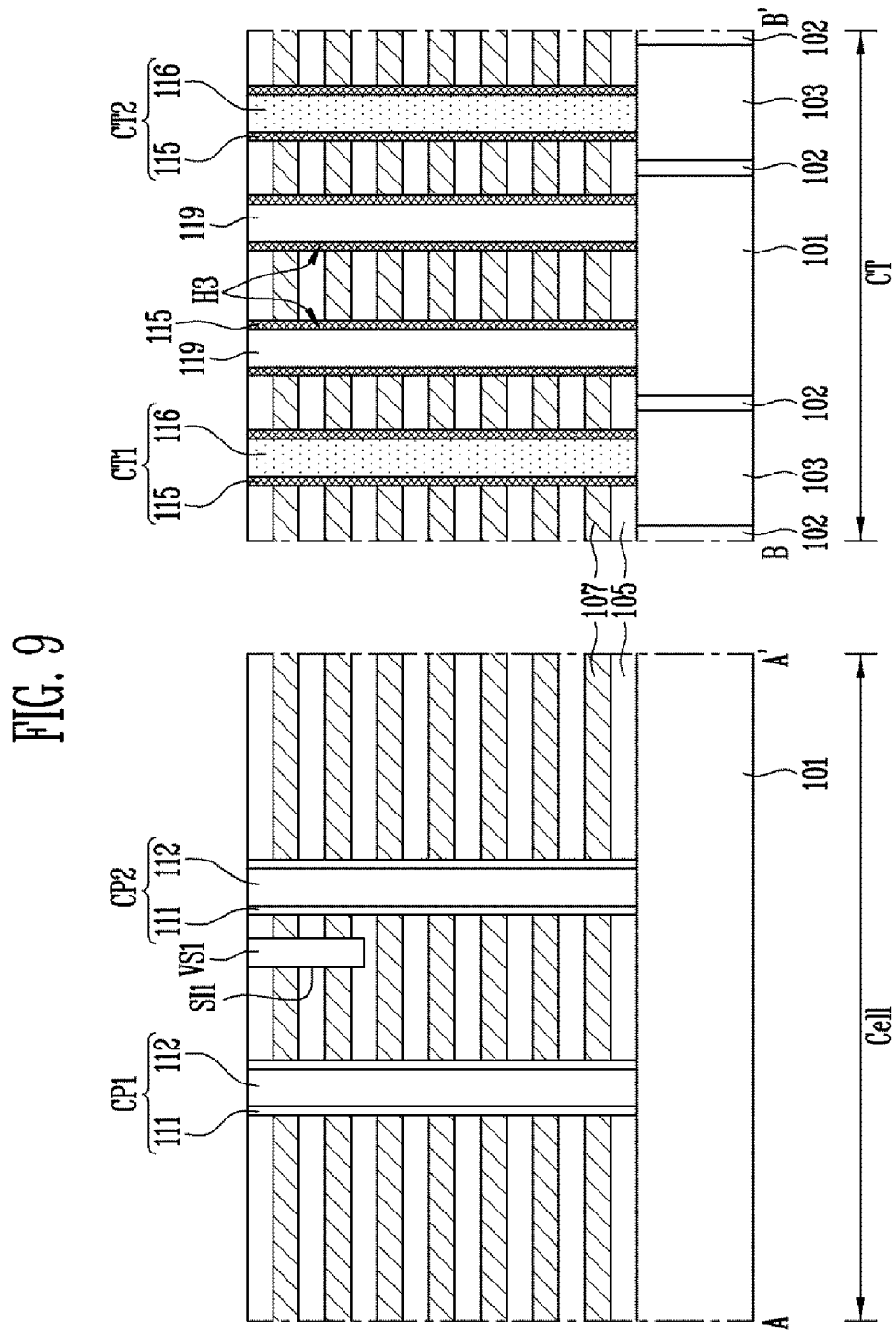

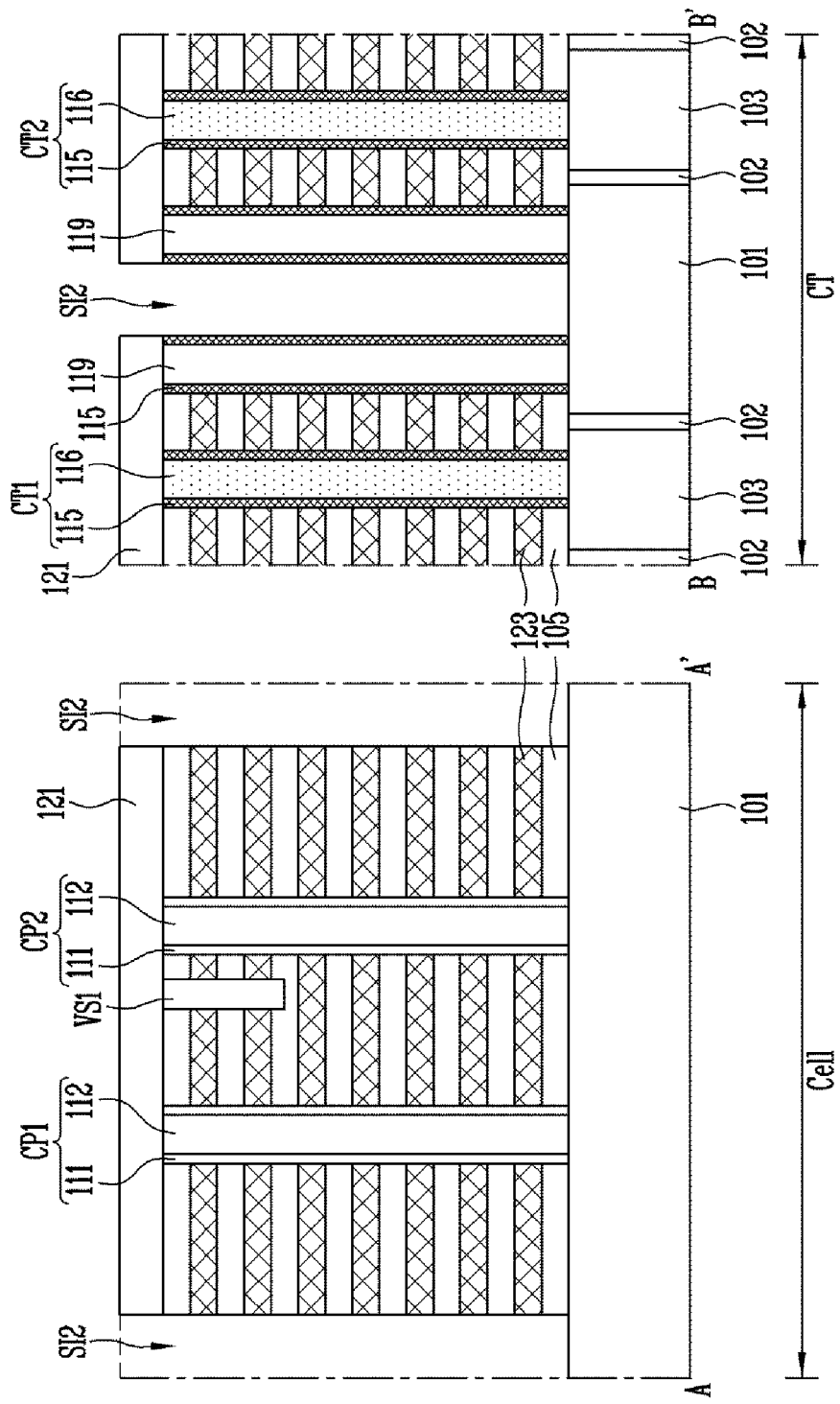

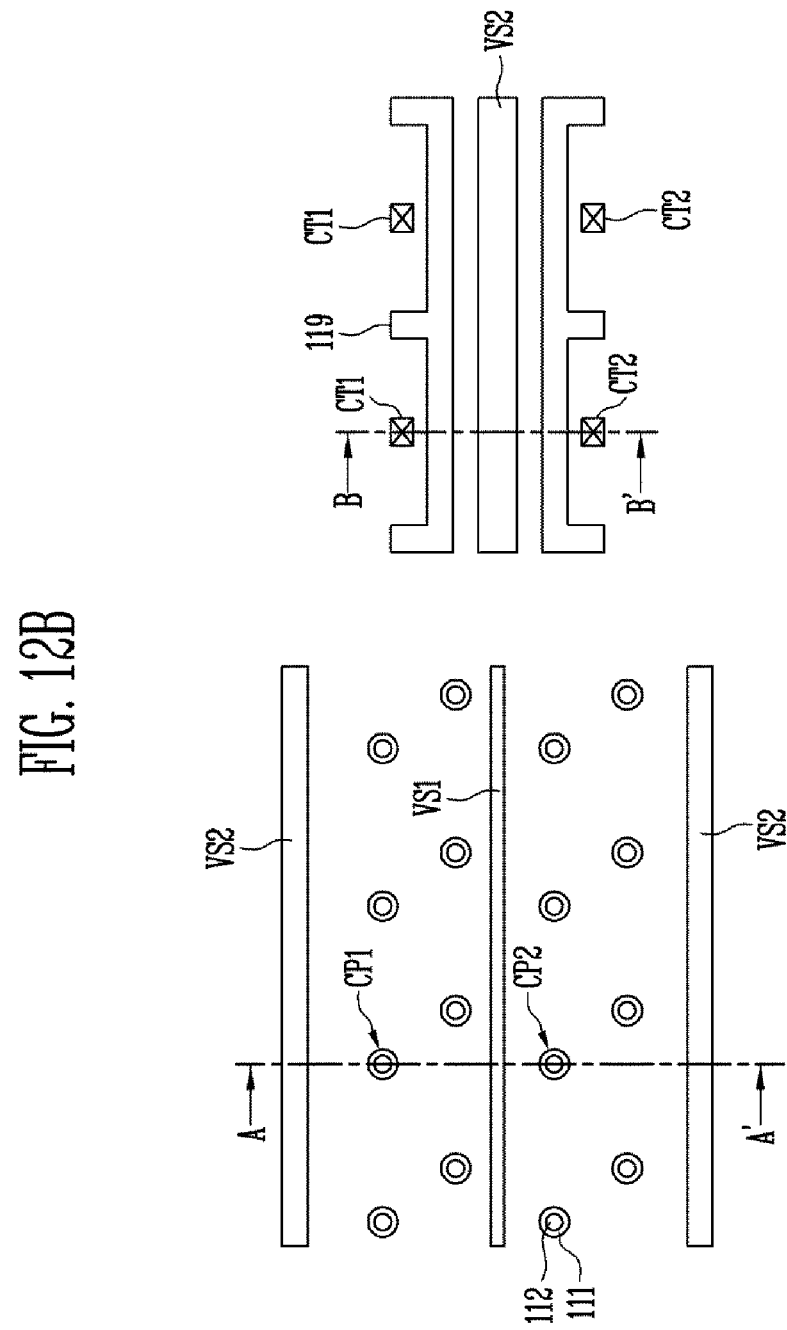

SEMICONDUCTOR DEVICE AND MANUFACTURING METHOD THEREOF

CROSS-REFERENCE TO RELATED APPLICATION

The present application is a divisional application Ser. No. 16/865,024, filed on May 1, 2020, and claims priority under 35 U.S.C. § 119(a) to Korean patent application number 10-2019-0118206 filed on Sep. 25, 2019, in the Korean Intellectual Property Office, the entire disclosure of which is incorporated herein by reference.

BACKGROUND

1. Technical Field

The present disclosure generally relates to an electronic device, and more particularly, to a semiconductor device and a manufacturing method thereof.

2. Related Art

A nonvolatile memory device is a memory device that retains stored data regardless of whether power is on or off. Increasing the integration density of two-dimensional non-volatile memory devices, forming memory cells in a single layer over a substrate, has been difficult. Thus, three-dimensional non-volatile memory devices have been proposed in which memory cells are stacked in a vertical direction over a substrate.

The three-dimensional memory device includes interlayer insulating layers and gate electrodes, which are stacked in an alternating manner. The three-dimensional memory device also includes channel layers that penetrate the interlayer insulating layers and the gate electrodes and memory cells that are stacked along the channel layers. Various structures and manufacturing methods have been developed to improve the operational reliability of the three-dimensional nonvolatile memory device.

SUMMARY

In accordance with an aspect of the present disclosure, there is provided a semiconductor device including: a stack structure including a plurality of interlayer insulating layers and a plurality of gate conductive layers, which are stacked in an alternating manner; at least one support structure penetrating the stack structure in a substantially vertical manner, the at least one support structure being formed in a contact region; a first barrier layer formed on a sidewall of each of the at least one support structure; and a contact plug penetrating the stack structure in a substantially vertical manner, the contact plug being formed in the contact region, the contact plug being connected to a contact pad that is disposed on the bottom of the stack structure, wherein the at least one support structure may be formed of an oxide layer.

In accordance with another aspect of the present disclosure, there is provided a method of manufacturing a semiconductor device, the method including: forming a stack structure in which a plurality of interlayer insulating layers and a plurality of sacrificial layers are stacked in an alternating manner; simultaneously forming first holes to form contact plugs that penetrate the stack structure and second holes to form support structures by etching the stack structure; forming contact plugs by filling the first holes with a barrier layer and a conductive layer for gates; simultaneously filling the third holes with the barrier layer and the conductive layer for gates while filling the first holes; forming, on the top of the stack structure, a mask pattern including first openings through which a region of the second holes is exposed; removing the conductive layer for gates in the second holes by performing a first etching process by using the mask pattern; and forming support structures by filling the second holes with an insulating layer.

In accordance with still another aspect of the present disclosure, there is provided a method of manufacturing a semiconductor device, the method including: forming a stack structure in which a plurality of interlayer insulating layers and a plurality of sacrificial layers are stacked in an alternating manner on a semiconductor substrate defined by a cell region and a contact region; forming first holes for channel plugs, which penetrate the stack structure by etching the stack structure in the cell region; forming channel plugs by filling the first holes with a memory layer and a channel layer; forming second holes for forming contact plugs and third holes for forming support structures by etching the stack structure in the contact region; forming contact plugs by filling the second holes with a barrier layer and a conductive layer for gates; simultaneously filling the third holes with the barrier layer and the conductive layer for gates while filling the second holes; forming, on the top of the stack structure, a mask pattern including first openings through which a region of the third holes is exposed and a second opening through which a partial region between the channel plugs is exposed; removing the conductive layer for gates in the third holes by performing a first etching process, using the mask pattern, and forming a first slit that penetrates at least one interlayer insulating layer and at least one sacrificial layer in a substantially vertical manner, the at least one sacrificial layer and the at least one interlayer insulating layer being disposed at an upper end portion of the stack structure between the channel plugs; and forming a first vertical structure and the support structures by filling the first slit and the second holes with an insulating layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 4, 5A, 5B, 6A, 6B, 7, 8A, 8B, 9, 10A, 10B, and 11 are sectional and plan views illustrating a manufacturing method of a semiconductor device in accordance with an embodiment of the present disclosure.

FIGS. 12A and 12B are plan views, illustrating a semiconductor device, in accordance with another embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, exemplary embodiments of the present disclosure will be described in detail with reference to the accompanying drawings in order for those skilled in the art to be able to readily implement the technical spirit of the present disclosure.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments provide a semiconductor device having an easy manufacturing process, a stable structure, and improved characteristics, and a manufacturing method of the semiconductor device.

Figure 1A:
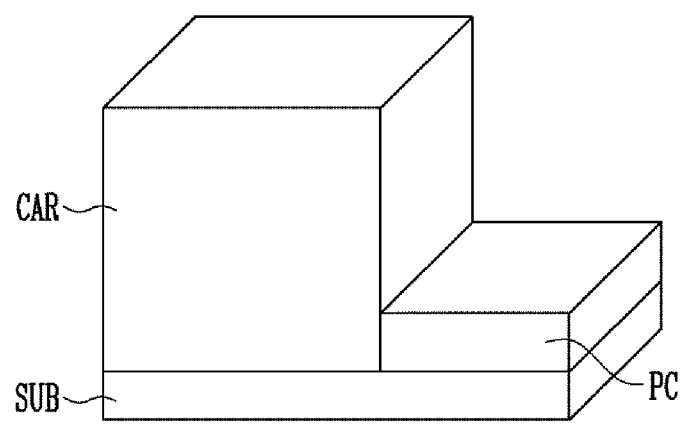
FIGS. 1A and 1B are block diagrams, schematically illustrating semiconductor devices, in accordance with embodiments of the present disclosure.
Figure 1B:
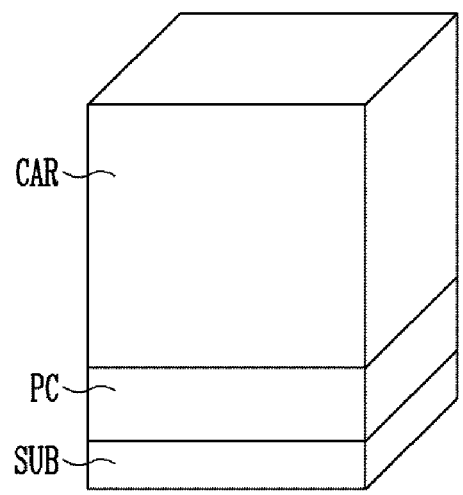

FIGS. 1A and 1B are block diagrams, schematically illustrating semiconductor devices, in accordance with embodiments of the present disclosure.

Referring to FIGS. 1A and 1B, each of the semiconductor devices may include a peripheral circuit structure PC and a cell array CAR, which are disposed on a substrate SUB.

The substrate SUB may be a single crystalline semiconductor layer. For example, the substrate SUB may be a bulk silicon substrate, a silicon-on-insulator substrate, a germanium substrate, a germanium-on-insulator substrate, a silicon-germanium substrate, or an epitaxial thin film that may be formed through a selective epitaxial growth process.

The cell array CAR may include a plurality of memory blocks. Each of the memory blocks may include a plurality of cell strings. Each of the cell strings may be electrically connected to a bit line, a source line, word lines, and select lines. Each of the cell strings may include memory cells and select transistors, which are connected in series. Each of the select lines may be used as a gate electrode of a select transistor corresponding thereto, and each of the word lines may be used as a gate electrode of a memory cell corresponding thereto.

The peripheral circuit structure PC may include NMOS transistors, PMOS transistors, a resistor, and a capacitor, which are electrically connected to the cell array CAR. The NMOS transistors, the PMOS transistors, the resistor, and the capacitor may be used as elements that constitute a row decoder, a column decoder, a page buffer, and a control circuit.

As shown in FIG. 1A, the peripheral circuit structure PC may be disposed on a partial region of the substrate SUB without overlapping with the cell array CAR.

Alternatively, as shown in FIG. 1B, the peripheral circuit structure PC may be disposed between the cell array CAR and the substrate SUB. The peripheral circuit structure PC overlaps with the cell array CAR so that the area of the substrate SUB, which is occupied by the cell array CAR and the peripheral circuit structure PC, may be reduced.

Figure 2:
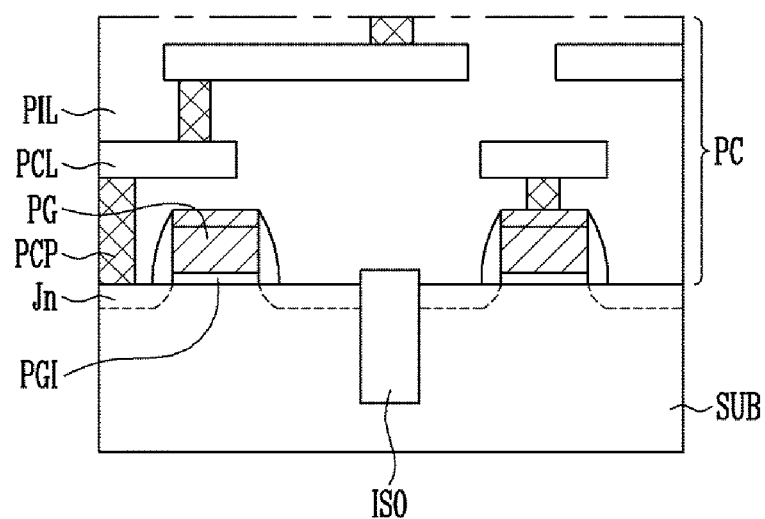
FIG. 2 is a sectional view, schematically illustrating a peripheral circuit structure.

FIG. 2 is a sectional view, schematically illustrating a peripheral circuit structure.

The peripheral circuit structure PC, shown in FIG. 2, may be included in the peripheral circuit structure that is shown in FIG. 1A or be included in the peripheral circuit structure that is shown in FIG. 1B.

Referring to FIG. 2, the peripheral circuit structure PC may include peripheral gate electrodes PG, a peripheral gate insulating layer PGI, junctions Jn, peripheral circuit lines PCL, and peripheral contact plugs PCP. The peripheral circuit structure PC may be covered by a peripheral circuit insulating layer PIL that may be formed on a substrate SUB.

The peripheral gate electrodes PG may be respectively used as gate electrodes of an NMOS transistor and a PMOS transistor of the peripheral circuit PC. The peripheral gate insulating layer PGI may be disposed between each of the peripheral gate electrodes PG and the substrate SUB.

The junctions Jn may be regions that are defined by injecting an n-type or p-type impurity into an active region. The junctions Jn may be disposed at both sides of each of the peripheral gate electrodes PG to be used as a source junction or a drain junction. The active region of the substrate SUB may be divided by an isolation layer ISO that may be formed in the substrate SUB. The isolation layer ISO may be formed of an insulating material.

The peripheral circuit lines PCL, through the peripheral contact plugs PCP, may be electrically connected to transistors, a resistor, and a capacitor, constituting a circuit of the peripheral circuit structure PC.

The peripheral circuit insulating layer PIL may include insulating layers that are stacked in a multi-layered structure.

Figure 3A:
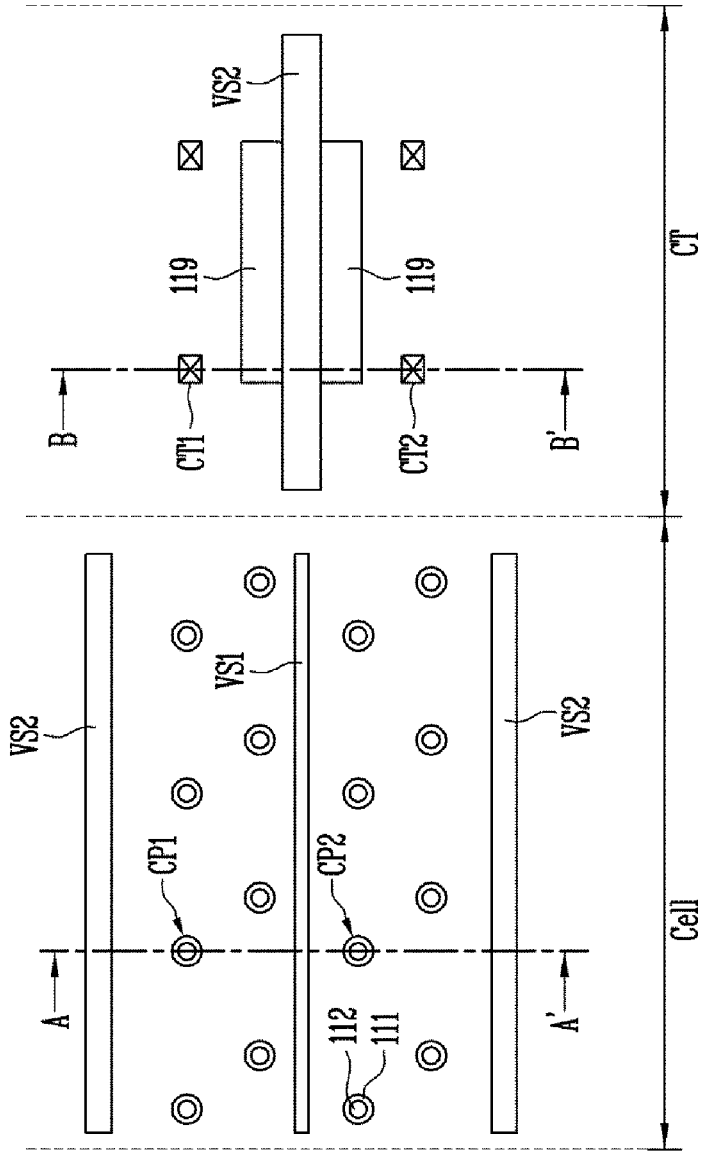
FIGS. 3A and 3B are plan and sectional views, illustrating a semiconductor device, in accordance with an embodiment of the present disclosure.
Figure 3B:
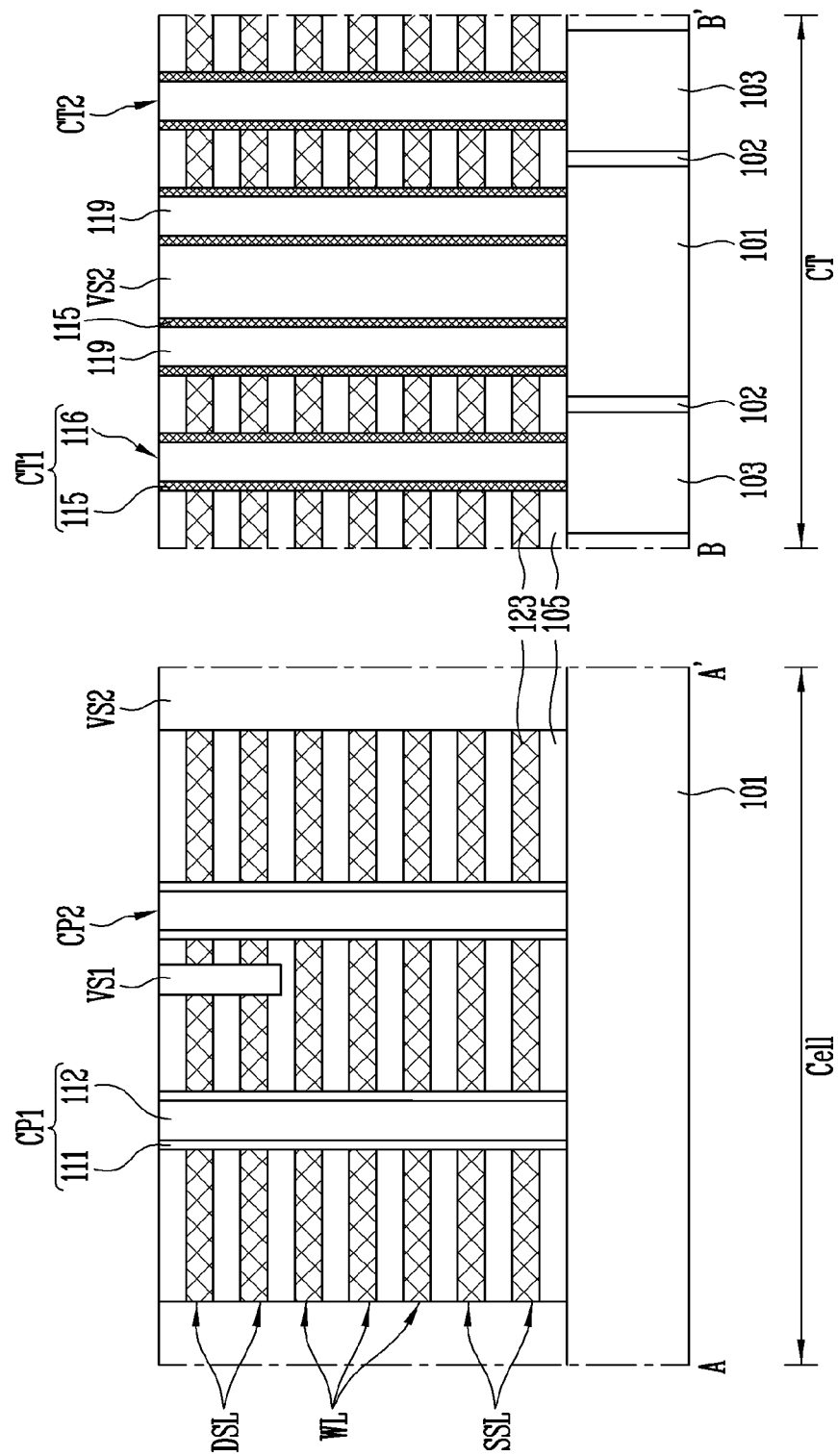

FIGS. 3A and 3B are plan and sectional views, illustrating a semiconductor device, in accordance with an embodiment of the present disclosure.

Referring to FIG. 3A, the cell array (CAR shown in FIGS. 1A and 1B) of the semiconductor device may include a cell region Cell and a contact region CT. A plurality of channel plugs CP1 and CP2 may be regularly arranged in the cell region Cell. In addition, a first vertical structure VS1, with a line-like shape, disposed between the plurality of channel plugs CP1 and the plurality of channel plugs CP2, may be disposed at a central portion of the cell region Cell. The second vertical structures VS2 may be arranged at both end portions of the cell region Cell, substantially parallel to the first vertical structure VS1. The plurality of channel plugs CP1 and CP2 may be arranged between the second vertical structures VS2. Each of the plurality of channel plugs CP1 and CP2 may include a channel layer 112 and a memory layer 111 that surround the channel layer 112. The first vertical structure VS1 and the second vertical structure VS2 may be insulating layers, and may be formed of, for example, an oxide layer. However, the composition of the insulating layers is not limited thereto.

A plurality of contact plugs CT1 and CT2 may be regularly arranged on the contact region CT. In addition, at least one support structure 119 and a second vertical structure VS2 may be arranged in a space between the plurality of contact plugs CT1 and CT2 on the contact region CT. In the embodiment, the support structure 119 and the second vertical structure VS2 may be disposed between the plurality of contact plugs CT1 and the plurality of contact plugs CT2. The support structure 119 may be formed of the same material as the first vertical structure VS1. The support structure 119 may be an insulating layer, and may be formed of, for example, an oxide layer. However, the composition of the insulating layer is not limited thereto. The support structure 119 and the second vertical structure VS2 may be disposed in a line shape extending in one direction, in substantially the same direction as the first vertical structure VS1 and second vertical structures VS2 of the cell region Cell. The support structure 119 and the second vertical structure VS2 may be substantially parallel to each other, without intersecting or overlapping with each other.

Referring to FIG. 3B, section A-A' may be a section of the cell region Cell, and section B-B' may be a section of the contact region CT.

The cell region Cell of the semiconductor device may include a source line layer 101, a stack structure 105/123 that is stacked on the source line layer 101, channel plugs CP1 and CP2 that penetrate the stack structure 105/123 in a vertical direction to come in contact with the source line layer 101, second vertical structures VS2 that are vertically disposed at both end portions of the stack structure 105/123 to be in contact with the source line layer 101, and a first vertical structure VS1 that is disposed to penetrate a portion of the stack structure 105/123 that is disposed between the channel plugs CP1 and CP2.

The source line layer 101 may be a doped semiconductor layer. For example, the source line layer 101 may be a semiconductor layer that is doped with an n-type impurity. In an embodiment, the source line layer 101 may be formed by injecting an impurity into a surface of the substrate SUB shown in FIG. 1A, or may be formed by depositing at least one doped silicon layer on the substrate SUB. In an embodiment, the source line layer 101 may be formed by forming an insulating layer on the peripheral circuit structure PC that is shown in FIG. 1B and then depositing at least one doped silicon layer on the insulating layer.

The stack structure 105/123 has a structure in which a plurality of gate conductive layers 123 and a plurality of interlayer insulating layers 105 may be stacked in an alternating manner, and the interlayer insulating layer 105 may be disposed at the lowermost and uppermost ends of the stack structure 105/123. At least one gate conductive layer 123 that is disposed at the lowermost end portion of the stack structure 105/123 may be a source select line SSL, at least one gate conductive layer 123 that is disposed at the uppermost end portion of the stack structure 105/123 may be a drain select line DSL, and the rest of the gate conductive layers may be word lines WL. In the embodiment, the first two gate conductive layers 123 that are disposed at the lowermost end portion of the stack structure 105/123 may the source select lines SSL, the first two gate conductive layers 123 that are disposed at the uppermost end portion of the stack structure 105/123 may the drain select lines DSL, and the rest of the gate conductive layers may be word lines WL.

The channel plugs CP1 and CP2 may penetrate the stack structure 105/123 and may be vertically arranged. Each of the channel plugs CP1 and CP2 may include a channel layer 112 and a memory layer 111 that surround the channel layer 112.

The first vertical structure VS1 may be disposed to penetrate at least one gate conductive layer 123 that is disposed at the uppermost end portion of the stack structure 105/123, disposed between the channel plugs CP1 and CP2, is the at least one gate conductive layer 123 being used as the drain select line DSL. That is, the first vertical structure VS1 electrically separates the portion of the drain select line DSL that is connected to the first channel plug CP1 from the drain select line DSL that is connected to the second channel plug CP2.

The contact region CT of the semiconductor device may include a source line layer 101, a contact pad layer 103, an isolation layer 102 that is disposed between the source line layer 101 and the contact pad layer 103, a stack structure 105/123 that is stacked on the source line layer 101, the isolation layer 102, and the contact pad layer 103, contact plugs CT1 and CT2 that penetrate the stack structure 105/123 in the vertical direction to come in contact with the contact pad layer 103, a second vertical structure VS2 that penetrates the stack structure 105/123 in the vertical direction to come in contact with the source line layer 101, and at least one support structure 119.

The source line layer 101 and the contact pad layer 103 may be formed on the same layer. The source line layer 101 and the contact pad layer 103 may be electrically separated from each other by the isolation layer 102 that is disposed therebetween. The isolation layer 102 may be an insulating layer, and may be formed of, for example, an oxide layer. However, the composition of the insulating layer is not limited thereto. The contact pad layer 103 may be electrically connected to the peripheral circuit structure PC that is shown in FIGS. 1A and 1B.

Each of the contact plugs CT1 and CT2 may include a conductive layer 116 for contact plugs and a barrier layer 115 that surrounds the conductive layer 116 for contact plugs. The barrier layer 115 may be formed on the sidewalls of the support structures 119.

In the semiconductor device, the support structure 119 for supporting the stack structure 105/123 may be disposed on the contact region CT and may be formed of the same material as the first vertical structure VS1 (i.e., an oxide layer), so that the oxidation and expansion of the support structure 119, due to heat that is generated in a subsequent process, may be prevented.

FIGS. 4 to 11 are sectional and plan views, illustrating a manufacturing method of a semiconductor device, in accordance with an embodiment of the present disclosure.

Referring to FIG. 4, a source line layer 101 may be formed on a cell region Cell and a contact region CT of the semiconductor device. The source line layer 101 may be a doped semiconductor layer. For example, the source line layer 101 may be a semiconductor layer that is doped with an n-type impurity. In an embodiment, the source line layer 101 may be formed by injecting an impurity into a surface of the substrate SUB, as shown in FIG. 1A, or may be formed by depositing at least one doped silicon layer on the substrate SUB. In an embodiment, the source line layer 101 may be formed by forming an insulating layer on the peripheral circuit structure PC, as shown in FIG. 1B, and then depositing at least one doped silicon layer on the insulating layer.

Subsequently, a contact pad layer may be formed may be formed by etching a portion of the source line layer 101 that may be formed on the contact region CT. The region in which the contact pad layer may be to be formed may be defined as a region that is electrically connected to the peripheral circuit structure PC, shown in FIGS. 1A and 1B. Subsequently, a contact pad layer 103 may be formed in the opening created by the etching and removal of the source line layer 101. An isolation layer 102 may be formed between the contact pad layer 103 and the source line layer 101 such that the contact pad layer 103 and the source line layer 101 may be electrically separated from each other. The isolation layer 102 may be an insulating layer, and may be formed of, for example, an oxide layer. However, the composition of the insulating layer is not limited thereto.

Subsequently, a stack structure 105/107, the first material layers 105 and the second material layers 107 being stacked in an alternating manner, may be formed on the cell region Cell and the contact region CT. The second material layers 107 may be used to form conductive layers such as a word line, a select line, and a pad, and the first material layers 105 may be used to insulate the stacked conductive layers from each other.

The first material layers 105 may be formed of a material with an etching rate that is higher than that of the second material layers 107. In an embodiment, the first material layers 105 may include an insulating material such as an oxide, and the second material layers 107 may include a sacrificial material such as a nitride.

Figure 5A:
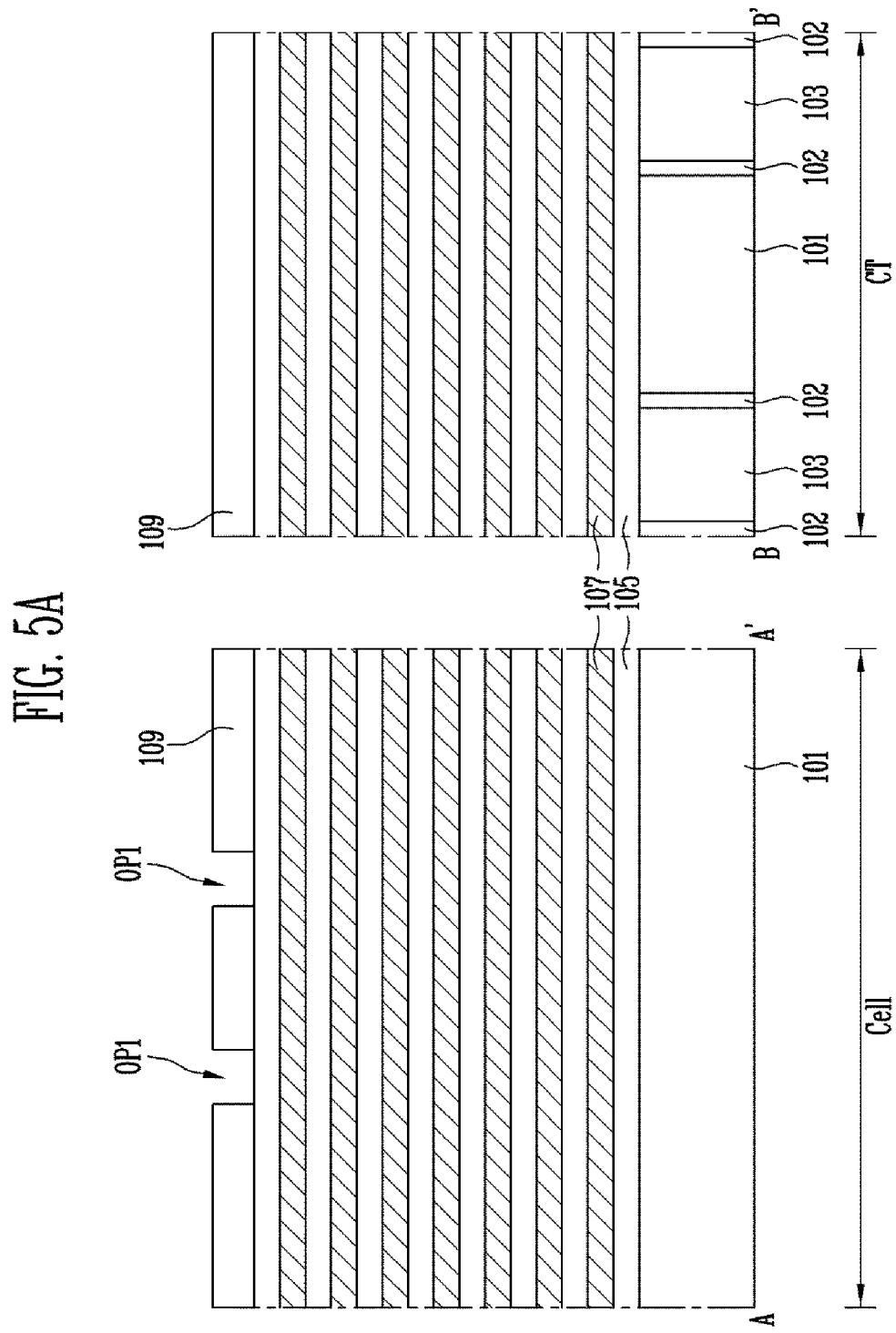

Referring to FIGS. 5A and 5B, a first mask pattern 109 may be formed on the cell region Cell and the contact region CT of the stack structure 105/107. The first mask pattern 109 has first openings OP1 in order to form channel plugs in the cell region Cell.

Figure 6B:
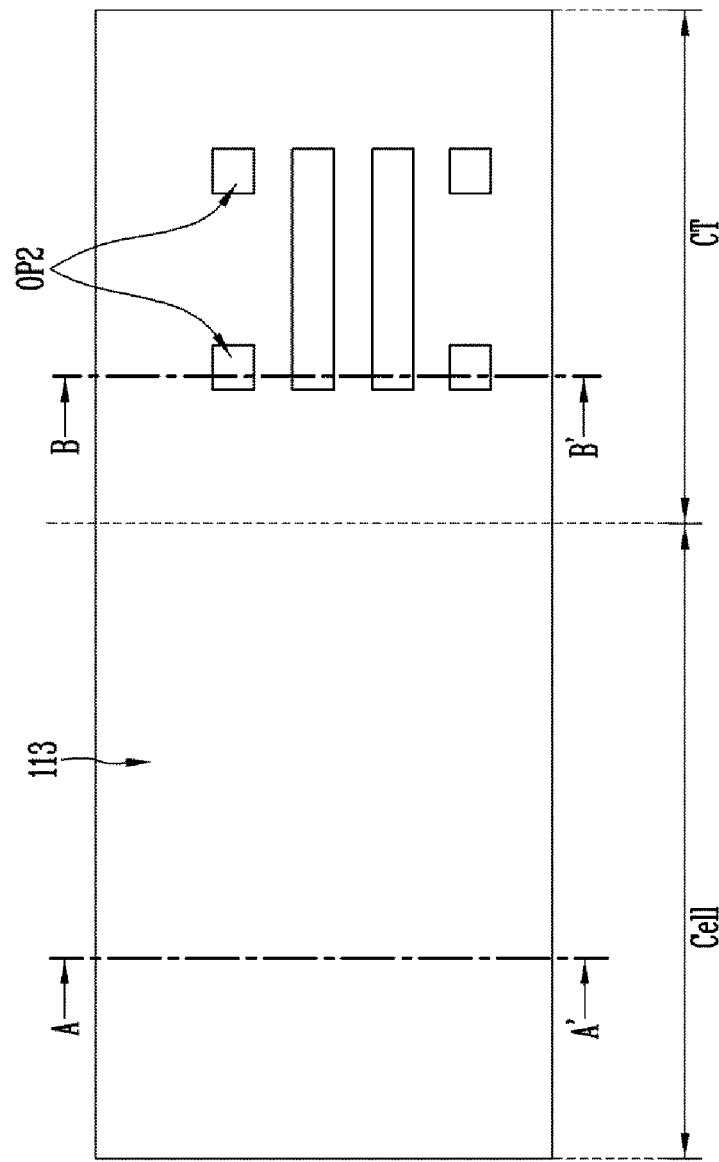

Referring to FIGS. 6A and 6B, first holes H1, penetrating the stack structure 105/107, may be formed by etching the stack structure 105/107 by using the first mask pattern as a barrier. The etching of the contact region CT may be prevented by the first mask pattern, and therefore, no holes are formed.

Subsequently, the first mask pattern may be removed.

Subsequently, channel plugs CP1 and CP2, each including a channel layer 112 and a memory layer 111 that sounds the channel layer 112, may be formed in the first holes H1. For example, first, the memory layer 111 may be formed on sidewalls of the first holes H1. The memory layer 111 may include at least one of a charge blocking layer, a data storage layer, and a tunnel insulating layer. The data storage layer may include a floating gate such as silicon, a charge trap material such as nitride, a phase change material, nano dots, and the like. Subsequently, the channel plugs CP1 and CP2 may be formed by completely filling the first holes H1 with the channel layer 112. In another embodiment, the channel layer 112 may be formed in a structure in which the central regions of the first holes H1 are opened, and a gap fill layer may be formed in the opened central regions.

Subsequently, a second mask pattern 113 may be formed over the channel plugs CP1 and CP2 and the stack structure 105/107 in the cell region Cell and the stack structure 105/107 in the contact region CT. The second mask pattern 113 has second openings OP2 in order to form contact plugs and support structures in the contact region CT. In the embodiment of the present disclosure, a case where the support structure is formed in a line shape is described as an example. However, the present disclosure is not limited thereto. For example, the support structure may be formed in various patterns such as a circular shape, an elliptical shape, a rectangular shape, a diamond shape, etc.

Referring to FIG. 7, second holes H2, penetrating the stack structure 105/107, may be formed by etching the stack structure 105/107 on the contact region CT by using the second mask pattern as a barrier. Etching of the cell region Cell may be prevented by the second mask pattern.

Subsequently, the second mask pattern is removed.

Subsequently, a barrier layer 115 may be formed on the sidewalls of the second holes H2. Then, contact plugs CT1 and CT2, connected to the contact pad layer 103, may be formed by filling the second holes H2 with a conductive layer 116.

The same process of forming the barrier layer 115 and the conductive layer 116 for contact plugs may be used to form the support structures that are connected to the source line layer 101. The forming of the contact plugs and the support structures may occur during the same process. That is, the barrier layer 115 may be formed on the sidewalls of the second holes H2 that expose the source line layer 101, and the same conductive layer 116 that is used for contact plugs may be formed inside of the second holes H2, connected to the source line layer 101.

Figure 8B:
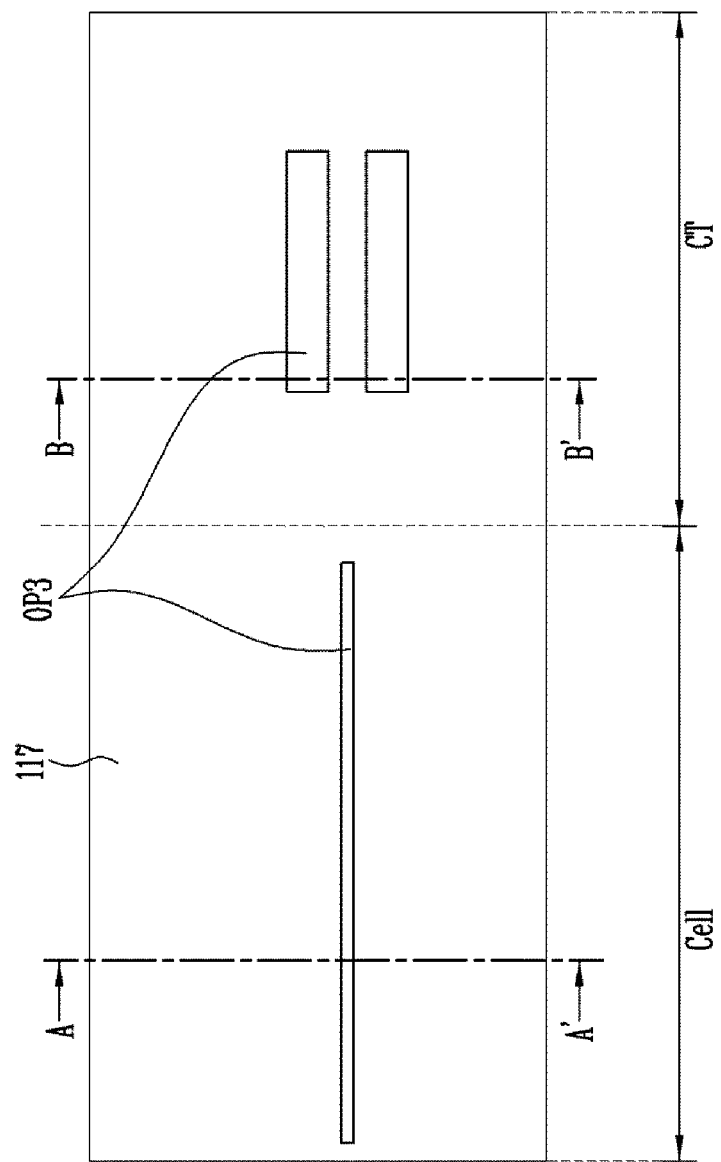

Referring to FIGS. 8A and 8B, a third mask pattern 117 may be formed over the channel plugs CP1 and CP2 and the stack structure 105/107 in the cell region Cell and the contact plugs CT1 and CT2 and the stack structure 105/107 in the contact region CT. The third mask pattern 117 may be formed to have third openings OP3 to form additional openings to subsequently form a first vertical structure in the cell region Cell, between the first channel plug CP1 and the second channel plug CP2, and support structures in the contact region CT. The third opening OP in the cell region Cell may be formed in a line shape, as shown in FIG. 8B, and the third opening OP3 of the contact region CT may be formed in a line shape, as shown in FIG. 8B. In another embodiment, the third opening OP3 of the contact region CT may be formed such that a portion of the conductive layer 116 for contact plugs, which may be formed in the region in which the support structure is to be formed, may be exposed.

Referring to FIG. 9, a first slit SI1 may be formed by etching a portion of an upper end portion of the stack structure 105/107, formed between the channel plugs CP1 and CP2 in the cell region Cell, using the third mask pattern as a barrier. The first slit SI1 may be formed to penetrate at least one second material layer 107 that is disposed at an uppermost end of the stack structure 105/107 at which a drain select line is to be formed.

Subsequently, third holes H3 may be formed by etching the conductive layer 116, which is exposed in the contact region CT, using the third mask pattern as the barrier. The barrier layer 115 may remain on sidewalls of the third holes H3.

Subsequently, a first vertical structure VS1 and support structures 119 may be simultaneously formed by filling the first slit SI1 and third holes H3 with an insulating layer. The first vertical structure VS1 and the support structures 119 may be formed of an oxide layer. However, the composition of the insulating layer is not limited thereto.

Figure 10B:
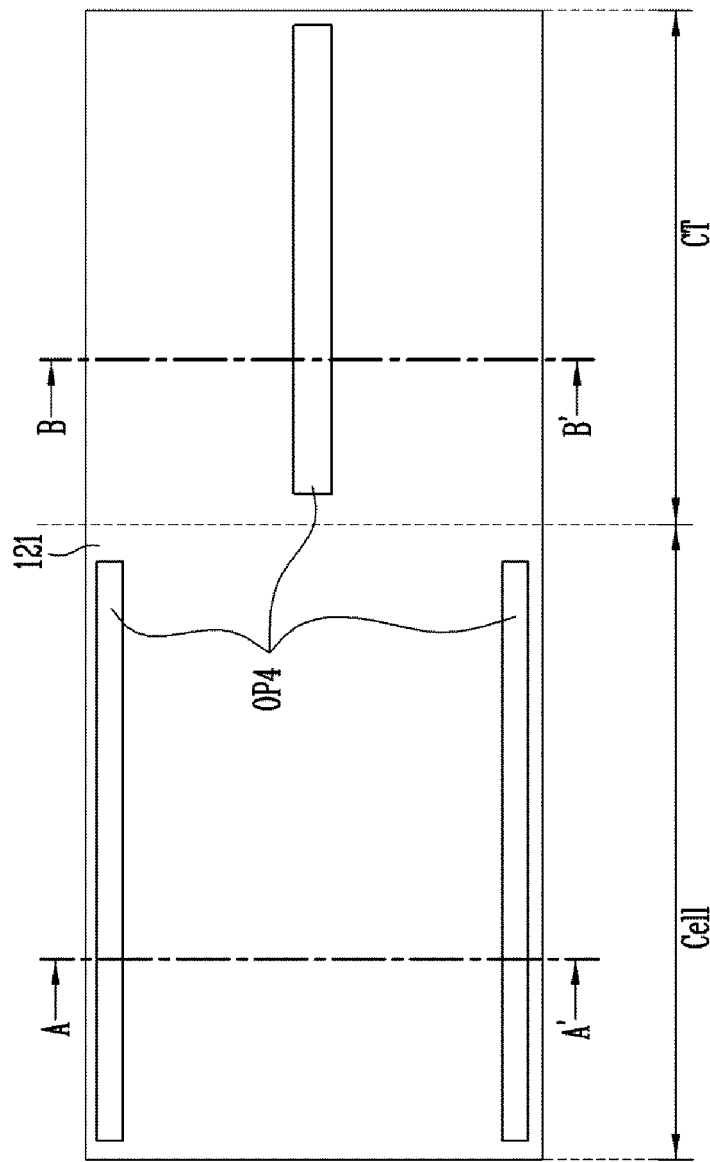

Referring to FIGS. 10A and 10B, a fourth mask pattern 121 may be formed over the channel plugs CP1 and CP2, the first vertical structure VS1, and the stack structure 105/107 in the cell region Cell. The fourth mask pattern 121 may also formed over the contact plugs CT1 and CT2, the support structures 119, and the stack structure 105/107 in the contact region CT. The fourth mask pattern 121 may be formed to have fourth openings OP4 at both end portions of a region in which the channel plugs CP1 and CP2 are disposed in the cell region Cell. The fourth mask pattern 121 may also be formed to have a fourth opening OP4 at a region between the support structures 119 in the contact region CT. That is, the fourth mask pattern 121 may be formed to have the fourth openings OP4 in order to form second vertical structures. The fourth openings OP4 may be formed in a line shape, as shown in FIG. 10B, and may be disposed to be substantially parallel to each other or disposed substantially vertically to each other. In different embodiments, the fourth openings OP4 may be formed in various shapes.

Subsequently, second slits SI2 may be formed by etching the stack structure 105/107 through the fourth openings OP4 by using the fourth mask pattern 121 as a barrier. The second slit SI2 exposes the sidewalls of the first material layer 105 and the second material layer 107.

Subsequently, the second material layers 107 may be removed through the second slit SI2, and the gate conductive layers 123 may be formed in place of the second material layers. At least one gate conductive layer 123 that is disposed at a lowermost end portion among the gate conductive layers 123 may be a lower select line (source select line), at least one gate conductive layer 123 that is disposed at an upper end portion and separated by the first vertical structure VS1 may be an upper select line (drain select line), and the rest of the gate conductive layers 123 may be word lines.

Figure 11:
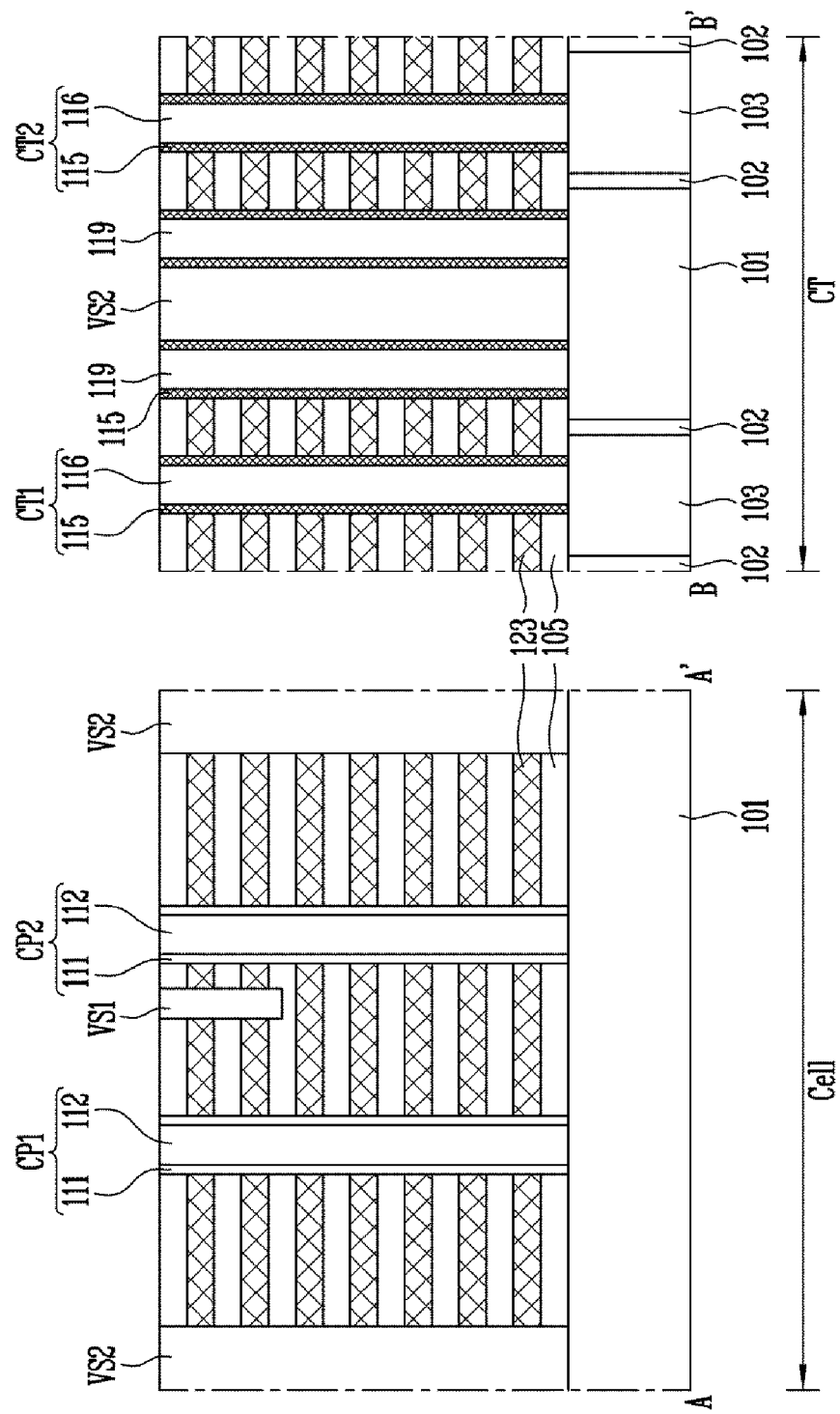

Referring to FIG. 11, second vertical structures VS2 may be formed by filling the second slits with an insulating layer. The second vertical structure VS2 may be formed of an oxide layer. However, the composition of the insulating layer is not limited thereto.

As described above, in accordance with the manufacturing method of the semiconductor device in accordance with the embodiment of the present disclosure, the support structure 119 may be formed of the same material as the first vertical structure VS1, i.e., an oxide layer, so that the oxidation and the expansion of the support structure 119, due to the heat that is generated in a subsequent process, may be prevented. Further, although the conductive layer 116 for contact plugs may be formed in the hole in which the support structure 119 is to be formed in the process of forming the contact plugs CT1 and CT2, the conductive layer 116 for contact plugs can be removed using the mask pattern for forming the first vertical structure VS1.

Figure 12A:
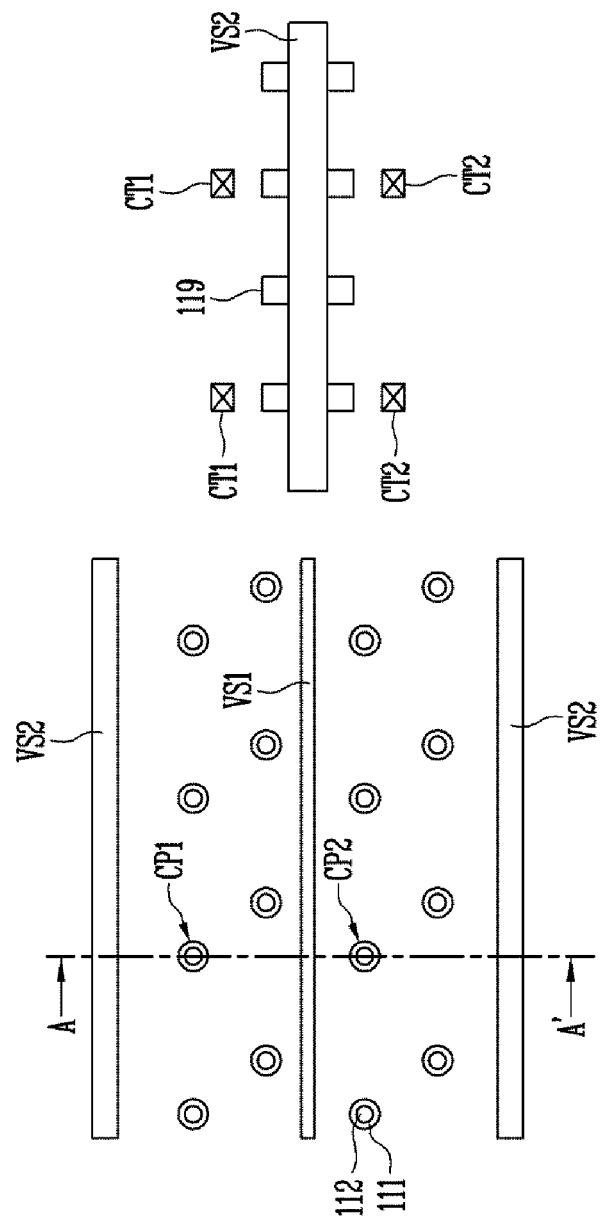

FIGS. 12A and 12B are plan views, illustrating a semiconductor device, in accordance with another embodiment of the present disclosure.

Referring to FIG. 12A, a plurality of support structures 119, formed in a quadrangular shape, may be disposed. Also, the support structures 119 may be disposed in a line, adjacent to a second vertical structure VS2, as shown in the drawing. Additionally, the support structures 119 may be disposed in spaces between contact plugs CT1 and CT2. That is, the support structures 119 may also be disposed in a space between the contact plugs CT1 and a space between the contact plugs CT2.

In different embodiments, the support structures 119 may be formed in various shapes, e.g., a circular shape, an elliptical shape, a cross (+) shape, and the like, in addition to the quadrangular shape.

Referring to FIG. 12B, the support structures 119 may be disposed to surround the periphery of the contact plugs CT1 and CT2. Although a case where one support structure 119 is disposed to surround the periphery of a plurality of contact plugs is illustrated in FIG. 12B, the present disclosure is not limited thereto. For instance, one support structure 119 may be formed in a concave shape to surround to the periphery of one contact plug.

Figure 13:
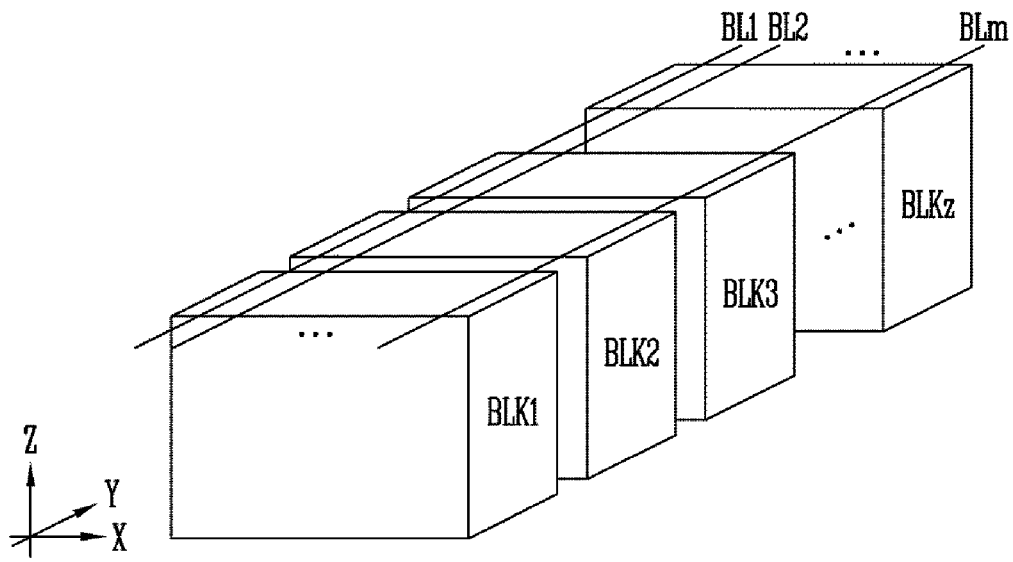
FIG. 13 is a view, illustrating memory blocks included in a semiconductor device, in accordance with an embodiment of the present disclosure.

FIG. 13 is a view, illustrating memory blocks included in a semiconductor device, in accordance with an embodiment of the present disclosure.

The semiconductor device may include a plurality of memory blocks BLK1 to BLKz. The plurality of memory blocks BLK1 to BLKz may be arranged to be spaced apart from each other along a direction Y in which bit lines BL1 to BLm extend. For example, first to zth memory blocks BLK1 to BLKz may be arranged to be spaced apart from each other along a second direction Y, and include a plurality of memory cells stacked along a third direction Z. The first to zth memory blocks BLK1 to BLKz may be spaced apart from each other by using slits.

Each of the plurality of memory blocks BLK1 and BLKz may include a plurality of channel plugs, a plurality of contact plugs, and a plurality of support structures as shown in FIGS. 3A and 3B or FIGS. 12A and 12B.

Figure 14:
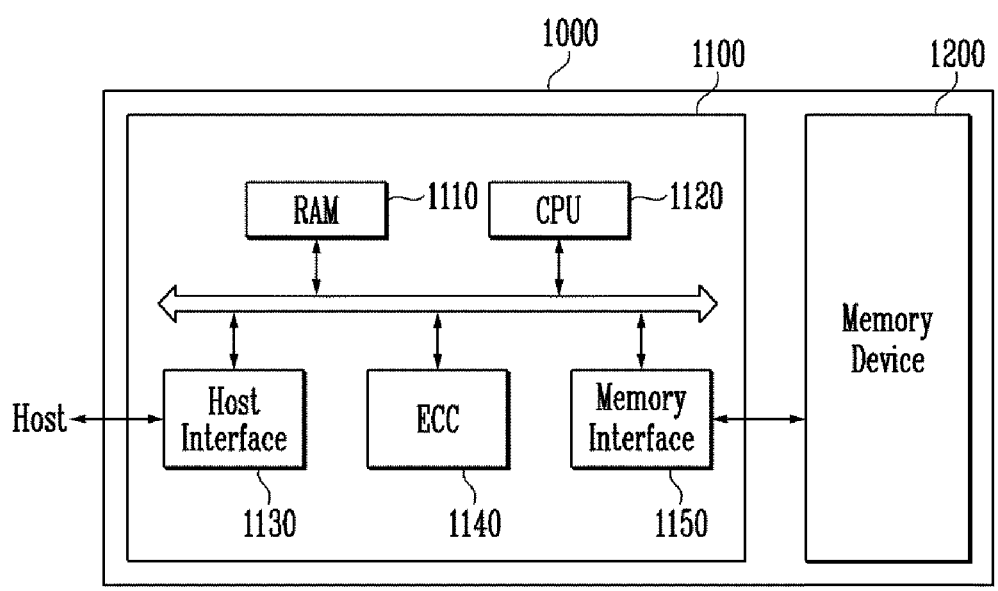
FIG. 14 is a block diagram, illustrating a configuration of a memory system, in accordance with an embodiment of the present disclosure.

FIG. 14 is a block diagram illustrating a configuration of a memory system in accordance with an embodiment of the present disclosure.

Referring to FIG. 14, the memory system 1000 in accordance with the embodiment of the present disclosure includes a memory device 1200 and a controller 1100.

The memory device 1200 may be used to store data information having various data formats such as texts, graphics, and software codes. The memory device 1200 may be the semiconductor device described with reference to FIGS. 1A, 1B, 2, 3A, and 3B, 12A, or 12B, and be manufactured according to the manufacturing method described with reference to FIGS. 4 to 11. The structure and manufacturing method of the memory device 1200 are the same as described above, and therefore, their detailed descriptions will be omitted.

The controller 1100 may be connected to a host and the memory device 1200, and may be configured to access the memory device 1200 in response to a request from the host. For example, the controller 1100 may be configured to control reading, writing, erasing, and background operations of the memory device 1200.

The controller 1100 includes a random access memory (RAM) 1110, a central processing unit (CPU) 1120, a host interface 1130, an error correction code (ECC) circuit 1140, a memory interface 1150, and the like.

The RAM 1110 may be used as a working memory of the CPU 1120, a cache memory between the memory device 1200 and the host, and a buffer memory between the memory device 1200 and the host. The RAM 1110 may be replaced with a static random access memory (SRAM), a read only memory (ROM), etc.

The CPU 1120 may be configured to control overall operations of the controller 1100. For example, the CPU 1120 may be configured to operate firmware such as a flash translation layer (FTL) stored in the RAM 1110.

The host interface 1130 may be configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 may be configured to detect and correct an error included in data that is read from the memory device 1200, using an error correction code (ECC).

The memory interface 1150 may be configured to interface with the memory device 1200. For example, the memory interface 1150 includes an NAND interface or NOR interface.

The controller 1100 may further include a buffer memory (not shown) for temporarily storing data. The buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 in accordance with the embodiment of the present disclosure includes the memory device 1200 having an improved degree of integration and improved characteristics, and thus the degree of integration and characteristics of the memory system 1000 can be improved.

Figure 15:
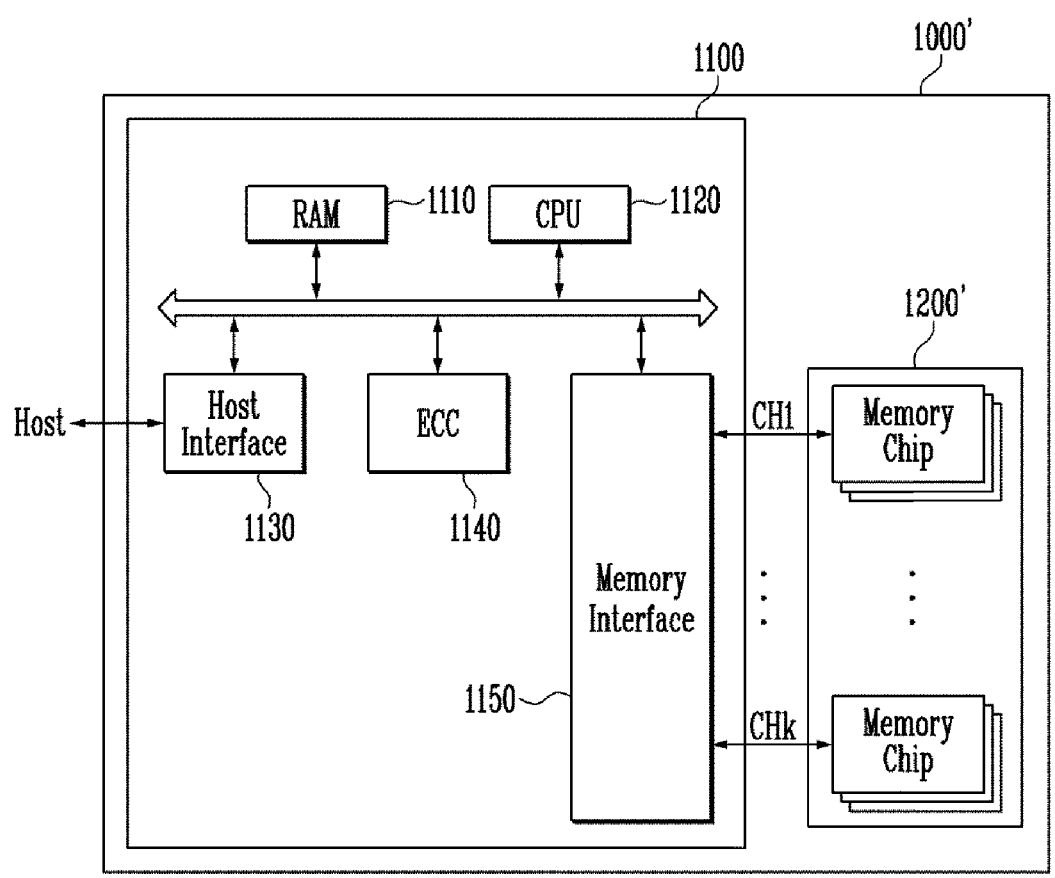
FIG. 15 is a block diagram, illustrating a configuration of a memory system, in accordance with an embodiment of the present disclosure.

FIG. 15 is a block diagram illustrating a configuration of a memory system in accordance with an embodiment of the present disclosure. Hereinafter, descriptions of contents overlapping with those described above will be omitted.

Referring to FIG. 15, the memory system 1000' in accordance with the embodiment of the present disclosure includes a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory. The memory device 1200' may be the semiconductor device described with reference to FIGS. 1A, 1B, 2, 3A, and 3B, 12A, or 12B, and be manufactured according to the manufacturing method described with reference to FIGS. 4 to 11. The structure and manufacturing method of the memory device 1200' are the same as described above, and therefore, their detailed descriptions will be omitted.

The memory device 1200' may be a multi-chip package including a plurality of memory chips. The plurality of memory chips may be divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip may be connected to one channel.

As described above, the memory system 1000' in accordance with the embodiment of the present disclosure includes the memory device 1200' having an improved degree of integration and improved characteristics, and thus the degree of integration and characteristics of the memory system 1000' can be improved. Particularly, the memory device 1200' may be configured as a multi-chip package, so that the data storage capacity of the memory system 1000' can be increased, and the operation speed of the memory system 1000' can be improved.

Figure 16:
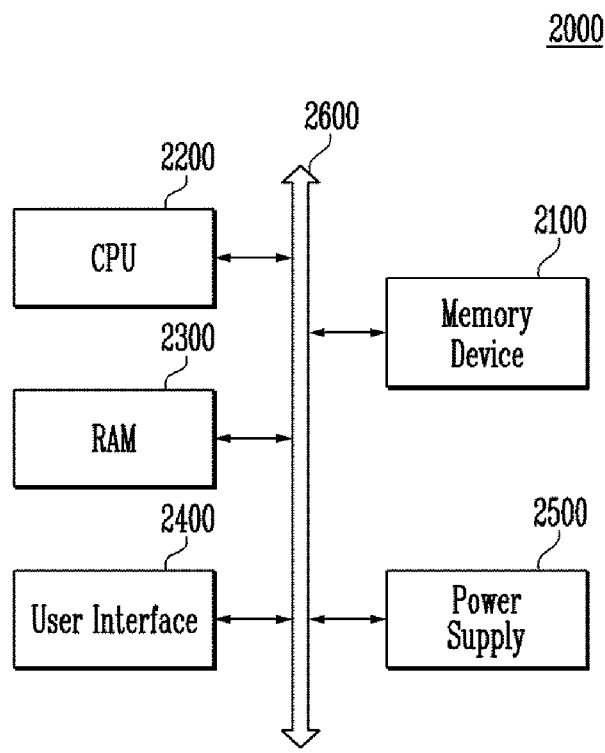
FIG. 16 is a block diagram, illustrating a configuration of a computing system, in accordance with an embodiment of the present disclosure.

FIG. 16 is a block diagram illustrating a configuration of a computing system in accordance with an embodiment of the present disclosure. Hereinafter, description of contents overlapping with those described above will be omitted.

Referring to FIG. 16, the computing system 2000 in accordance with the embodiment of the present disclosure includes a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 may be electrically connected to the CPU 2200, the RAM 2300, the user interface 2400, the power supply 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

The memory device 2100 may be a nonvolatile memory. The memory device 2100 may be the semiconductor device described with reference to FIGS. 1A, 1B, 2, 3A, and 3B, 12A, or 12B, and be manufactured according to the manufacturing method described with reference to FIGS. 4 to 11. The structure and manufacturing method of the memory device 2100 are the same as described above, and therefore, their detailed descriptions will be omitted.

The memory device 2100 may be a multi-chip package including a plurality of memory chips as described with reference to FIG. 9.

The computing system 2000 configured as described above may be a computer, an ultra-mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 in accordance with the embodiment of the present disclosure includes the memory device 2100 having an improved degree of integration and improved characteristics, and thus characteristics of the computing system 2000 can also be improved.

Figure 17:
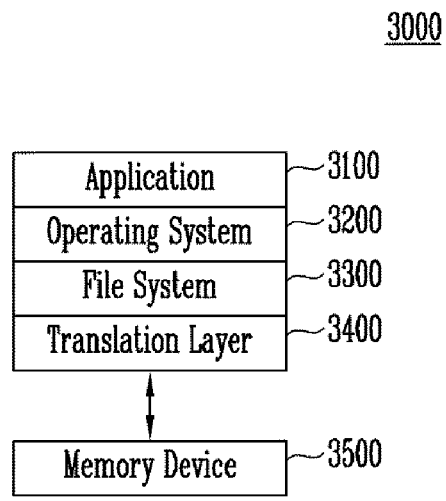
FIG. 17 is a block diagram, illustrating a configuration of a computing system, in accordance with an embodiment of the present disclosure.

FIG. 17 is a block diagram illustrating a configuration of a computing system in accordance with an embodiment of the present disclosure.

Referring to FIG. 17, the computing system 3000 in accordance with the embodiment of the present disclosure includes a software layer including an operating system 3200, an application 3100, a file system 3300, a translation layer 3400, and the like. In addition, the computing system 3000 includes a hardware layer of a memory device 3500, etc.

The operating system 3200 may manage software resources, hardware resources, etc. of the computing system 3000, and control program execution of a central processing unit. The application 3100 may be one of a variety of application programs running on the computing system 3000, and may be a utility executed by the operating system 3200.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Mapping information between the logical address and the physical address may be stored as an address translation table. For example, the translation layer 3400 may be a flash translation layer (FTL), a universal flash storage link layer (ULL), etc.

The memory device 3500 may be a nonvolatile memory. The memory device 3500 may be the semiconductor device described with reference to FIGS. 1A, 1B, 2, 3A, and 3B, 12A, or 12B, and be manufactured according to the manufacturing method described with reference to FIGS. 4 to 11. The structure and manufacturing method of the memory device 3500 are the same as described above, and therefore, their detailed descriptions will be omitted.

The computing system 3000 configured as described above may be divided into an operating system layer performed in an upper level region and a controller layer performed in a lower level region. The application 3100, the operating system 3200, and the file system 3300 are included in the operating system layer, and may be driven by a working memory of the computing system 3000. In addition, the translation layer 3400 may be included in the operating system layer or the controller layer.

As described above, the computing system 3000 in accordance with the embodiment of the present disclosure includes the memory device 3500 having an improved degree of integration and improved characteristics, and thus characteristics of the computing system 3000 can also be improved.

In accordance with the present disclosure, a semiconductor device having a stable structure can be manufactured, and manufacturing cost can be reduced by simplifying manufacturing procedures.

The exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A method of manufacturing a semiconductor device, the method comprising:
   forming a stack structure in which a plurality of interlayer insulating layers and a plurality of sacrificial layers are stacked in an alternating manner;
   simultaneously forming first holes to form contact plugs that penetrate the stack structure and second holes to form support structures by etching the stack structure;
   forming contact plugs by filling the first holes with a barrier layer and a conductive layer for gates;
   simultaneously filling the second holes with the barrier layer and the conductive layer for gates while filling the first holes;
   forming, on the top of the stack structure, a mask pattern including first openings through which a region of the second holes is exposed;
   removing the conductive layer for gates in the second holes by performing a first etching process by using the mask pattern; and
   forming support structures by filling the second holes with an insulating layer.

2. The method of claim 1, wherein the contact plugs are formed in the first holes, and simultaneously, the barrier layer and the conductive layer for gates are formed in the second holes.

3. The method of claim 1, wherein the mask pattern further includes a second opening to allow for the formation of a first vertical structure in the stack structure.

4. The method of claim 3, further comprising forming a first slit that penetrates at least one sacrificial layer and at least one interlayer insulating layer in a substantially vertical manner, the at least one sacrificial layer and the at least one interlayer insulating layer being disposed at an upper end portion of the stack structure, by performing a second etching process using the mask pattern.

5. The method of claim 4, wherein the support structures are formed by filling the second holes with the insulating layer, and simultaneously, the first vertical structure is formed by filling the first slit with the insulating layer.

6. The method of claim 5, wherein the first vertical structure is an isolation layer for electrically separating a gate conductive layer for upper select lines.

7. The method of claim 1, further comprising:
   forming second slits that penetrate the stack structure after the support structures are formed;
   removing the plurality of sacrificial layers that are exposed through the second slits; and
   forming conductive layers for gates to replace the plurality of sacrificial layers.

8. A method of manufacturing a semiconductor device, the method comprising:
   forming a stack structure in which a plurality of interlayer insulating layers and a plurality of sacrificial layers are stacked in an alternating manner on a semiconductor substrate defined by a cell region and a contact region;

forming first holes for channel plugs, which penetrate the stack structure by etching the stack structure in the cell region;

forming channel plugs by filling the first holes with a memory layer and a channel layer;

forming second holes for forming contact plugs and third holes for forming support structures by etching the stack structure in the contact region;

forming contact plugs by filling the second holes with a barrier layer and a conductive layer for gates;

simultaneously filling the third holes with the barrier layer and the conductive layer for gates while filling the first holes;

forming, on the top of the stack structure, a mask pattern including first openings through which a region of the third holes is exposed and a second opening through which a partial region between the channel plugs is exposed;

removing the conductive layer for gates in the third holes by performing a first etching process, using the mask pattern, and forming a first slit that penetrates at least one interlayer insulating layer and at least one sacrificial layer in a substantially vertical manner, the at least one gate conductive layer and at least one interlayer insulating layer being disposed at an upper end portion of the stack structure between the channel plugs; and forming a first vertical structure and the support structures by filling the first slit and the second holes with an insulating layer.

9. The method of claim 8, wherein the contact plugs are formed in the second holes, and simultaneously, the barrier layer and the conductive layer for gates are formed in the third holes.

10. The method of claim 9, wherein the barrier layer remains on a sidewall of the support structures.

11. The method of claim 8, further comprising:
forming second slits that penetrate the stack structure of the cell region and the contact region, after the support structures are formed;
removing the plurality of sacrificial layers that are exposed through the second slits; and
forming conductive layers for gates to replace the plurality of sacrificial layers.

12. The method of claim 11, wherein at least one conductive layer for gates, which is disposed at an upper portion among the conductive layers for gates, is separated by the first vertical structure.

13. The method of claim 8, wherein the support structures have a line shape extending in one direction, a quadrangular shape, a circular shape, an elliptical shape, a cross (+) shape or a concave shape, and
wherein the support structures are disposed to surround the periphery of the contact plugs.

* * * * *